(12) United States Patent
Goto

(10) Patent No.: US 6,829,023 B2
(45) Date of Patent: Dec. 7, 2004

(54) LIGHT-EMITTING DISPLAY DEVICE

(75) Inventor: Yasumasa Goto, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 09/986,463

(22) Filed: Nov. 8, 2001

(65) Prior Publication Data
US 2002/0063515 A1 May 30, 2002

(30) Foreign Application Priority Data

Nov. 9, 2000 (JP) ........................................ 2000-341843

(51) Int. Cl.[7] ........................ G02F 1/1335; G02F 1/136
(52) U.S. Cl. ........................ 349/113; 349/43; 349/143; 349/144; 257/98
(58) Field of Search ........................ 349/113, 43, 143, 349/144, 108, 138, 193, 179; 257/98, 72, 758; 313/500

(56) References Cited

U.S. PATENT DOCUMENTS 6,046,547 A * 4/2000 Nishio et al. ............. 315/169.3
6,166,792 A * 12/2000 Miyawaki et al. .......... 349/113
6,529,255 B1 * 3/2003 Sekiguchi .................. 349/113

* cited by examiner

Primary Examiner—Jerome Jackson
Assistant Examiner—Joseph Nguyen
(74) Attorney, Agent, or Firm—Pillsbury Winthrop LLP

(57) ABSTRACT

The present invention provides a light-emitting display device to improve the throughput efficiency of light transmitting from the light-projecting surface. The light-emitting display device is provided with a plurality of anodes isolated from each other by isolating films in the shape of islands, cathodes arranged opposite to the anodes and a plurality of pixels disposed in the form of a matrix. The pixels are held between the anodes and the cathodes. Each of the pixels has at least a thin film layer including a luminous layer which emits light when a predetermined voltage is applied between the anode and the cathode. The anode defines the light-projecting surface to transmit light from the organic thin film. The cathode is provided with a declined surface between adjacent ones of the pixels. The declined surface defines an acute angle with respect to the light-projecting surface.

10 Claims, 7 Drawing Sheets

LIGHT-EMITTING DISPLAY DEVICE

BACKGROUND OF THE INVENTION

Field of the Invention

This invention relates to a light-emitting display device.

Display devices using light-emitting diodes, liquid crystal display devices, or organic EL (electro luminescence) devices as a light modulation layer of a pixel are apt to expand their application ranges in addition to display devices such as business machines and computers primarily because the display units can be thinned. Among these display devices, a light-emitting display device using organic EL devices has the following advantages compared with a liquid crystal display device (LCD).

(a) Since the organic light-emitting display device is of a self-emission type, a clear display and a wide viewing angle can be obtained. Further, low power consumption, lightweight, and thin thickness can be realized because no rear light source is necessary.

(b) The response speed is fast. The response speed of organic light-emitting display device is on the order of microseconds ($\mu$s) while that of an LCD is on the order of milliseconds (ms).

(c) Since a solid luminous layer is used, there is the possibility that the working temperature range may be wider.

On the basis of these advantages, research and development of organic light-emitting display devices have been promoted actively. Particularly, there have been carried out those of a polycrystalline silicon thin film transistor (p-Si TFT) type organic self-emission display system. Pixels of this display system are disposed in a matrix form and each connected p-Si TFTs for driving the display device so that such a display system can realize high resolution.

FIG. 10 shows schematically a cross-sectional view of an array substrate in a conventional organic light-emitting display device. An organic thin film layer including at least an organic luminous layer 113 is held between an anode 109 and a cathode 115. When an energizing voltage is supplied between the anode and the cathode, electrons and holes are injected into the organic thin layer where they are recombined. Thus, exciters are generated in the organic thin layer. Light is emitted from the organic thin layer when the exciters lose energy by transferring from a higher energy level to a lower one.

The organic light-emitting display device, as shown in FIG. 10, has an opening above the anode 109 and a and a driving TFT. The driving TFT includes a p-Si layer 103, a gate insulating film 104, a gate electrode 105, and source and drain electrodes 107. A passivation film 110 and a partition insulating film 111 are formed over the p-Si layer 103, gate insulating film 104, gate electrode 105 and source and drain electrodes 107.

The luminous intensity of such a conventional organic light-emitting display device is about a half of the luminous intensity (100 to 150 nt) of the LCD. Further, cross-talk occurs between neighboring pixels. Where, in particular, the color of red (R), green (G), or blue (B) is emitted from the pixel, colors from neighboring pixels are mixed so that the contrast of the organic light-emitting display device is considerably lowered.

SUMMARY OF THE INVENTION

An object of the present invention is to provide a solution for the aforementioned problem.

An object of the present invention is to provide a light-emitting display device with improvement of the output efficiency of light from the light-projecting surface.

Another object of the present invention is to suppress the occurrence of cross talk between neighboring pixels.

A first aspect of a light-emitting display device in accordance with the present invention includes pixels which are provided with a plurality of first electrodes electrically isolated from each other; second electrodes provided opposite to the first electrodes; a plurality of pixels held between the first and second electrodes; and a light-reflecting surface disposed between adjacent ones of said pixel electrodes.

The pixels are disposed in a matrix form and each have at least a light-emitting layer. One of the first and second electrode defines a light-projecting surface. The light-reflecting surface transmits light traveling from one of the adjacent pixels toward the other thereof to the light-projecting surface.

A second aspect of a light-emitting display device in accordance with the present invention further includes partition insulation films to electrically isolate the first electrodes from each other. The partition insulation films define openings between the adjacent pixels. The other of the first and second electrodes provides opposite to the light-projecting surface via the luminous layer includes inclined surfaces provided along the partition insulation films. The inclined surfaces are used for the light-reflecting surfaces and define an acute angle with respect to the light-projecting surface.

A third aspect of a light-emitting display device in accordance with the present invention is characterized in that the second electrodes are continuously formed on the pixels.

A fourth aspect of a light-emitting display device in accordance with the present invention is characterized in that the inclined surfaces are formed around the pixels.

A fifth aspect of a light-emitting display device in accordance with the present invention further includes partition insulation films to electrically isolate the first electrodes from each other. The partition insulation films define openings around the pixels. The second electrodes are provided to cover the partition insulation films and include inclined surfaces at the openings which define an acute angle with respect to the light-projecting surface.

The above-stated and other objects and advantages of the invention will become apparent from the following description when taken with the accompanying drawings. It will be understood, however, that the drawings are for purposes of illustration and are not to be construed as defining the scope or limit of the invention, reference being had for the latter purpose to the claims appended hereto.

DETAILED DESCRIPTION OF THE INVENTION

Figure 1:
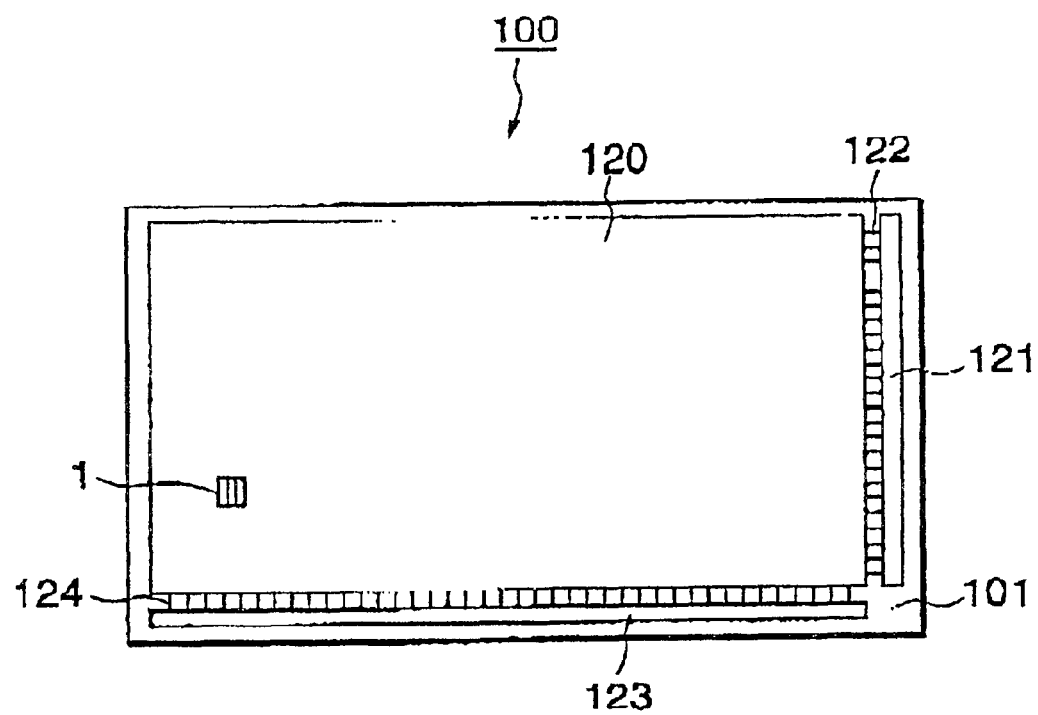
FIG. 1 is a plan view of an array substrate of a light-emitting display device in accordance with the present invention.

The preferred embodiments of the present invention will be explained in detail hereinafter with reference to the accompanying drawings. The first embodiment of the present invention is shown in FIG. 1 which is a schematic plan view of an array substrate 100 for an organic light emitting display device. The array substrate 100 includes a display area 120 in which pixels 1 are disposed in a matrix form (not shown). Two sides of the display area 120 are provided with an X direction driving circuit 121 and a Y direction driving circuit 123. The X direction driving circuit 121 is disposed on the right side of the drawing and connected to wires 122 led from the respective pixels. The Y direction driving circuit 123 is disposed on the lower side of the drawing and connected to wires 123 124 led from the respective pixels.

Figure 2:
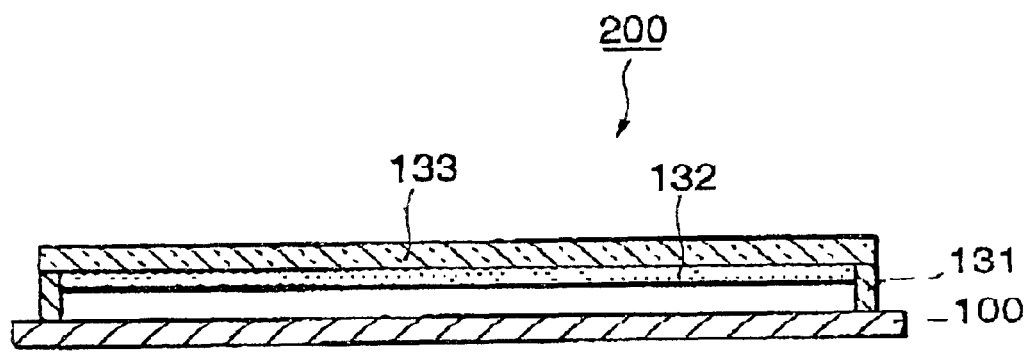
FIG. 2 is a longitudinal cross-section of the organic light-emitting display device shown in FIG. 1.

FIG. 2 shows schematically a longitudinal cross section of an organic light-emitting display device 200. The array substrate 100 shown in FIG. 1 is incorporated into the organic light-emitting display device 200. Sealing members 131 are provided at the edges of the light-emitting display device. An opposite substrate 133, for example a glass substrate, is mounted on the sealing members 131. On the inner surfaces of the glass substrate 133 is coated with a desiccant 132 such as zeolite or BaO Coated. Further, drying nitrogen is filled inside the organic light-emitting display device 200. A display surface of the organic light-emitting display device 200 is on the array substrate.

Figure 3A:
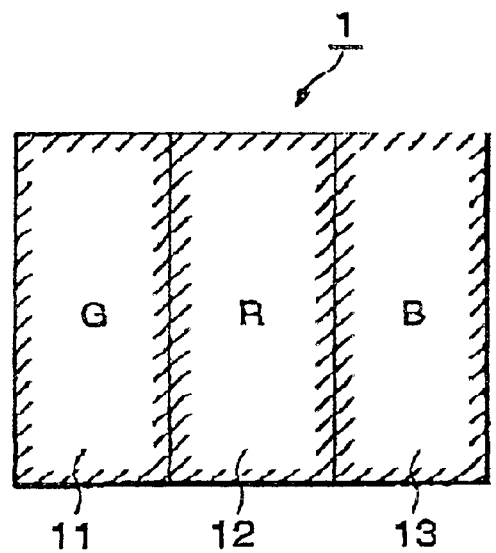
FIG. 3(a) is a plan view of pixels of a light-emitting display device.
Figure 3B:
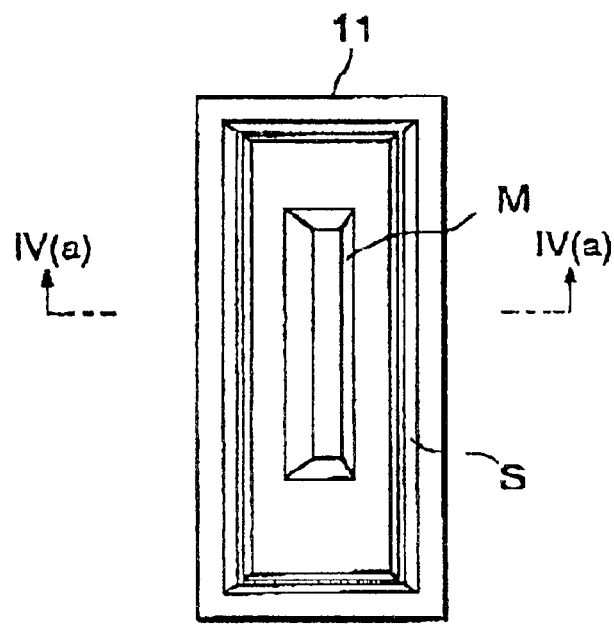
FIG. 3(b) shows schematically a partial cross section of one pixel of the present invention.

As shown in FIG. 3(a), the display area of the light-emitting display device includes a plurality of pixels 1 to be disposed in a matrix form (not shown). The pixels 1 are composed of red, green and blue color elements 11, 12 and 13. FIG. 3(b) is a schematic plan view of one pixel 11. The pixel 11 has openings M and S to be explained later.

Figure 4A:
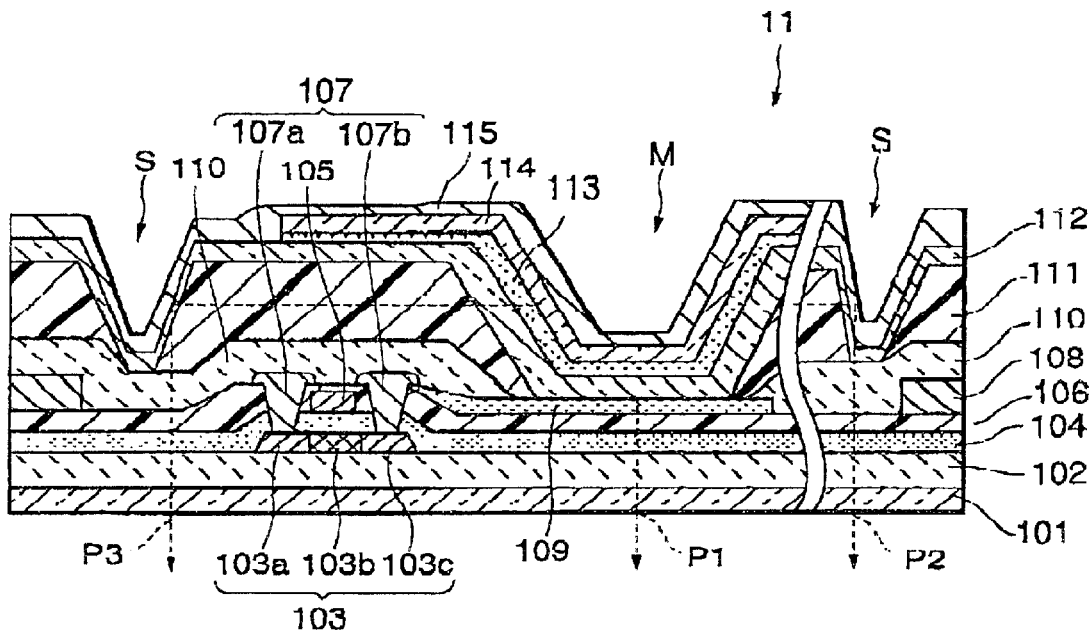
FIG. 4(a) shows a longitudinal cross-section of a pixel in accordance with the present invention.

FIG. 4(a) shows a cross sectional view of a pixel along a cutting line IV(a)—IV(a) of the pixel shown in FIG. 3(b). The TFT shown in the drawing is a driving TFT.

Figure 5:
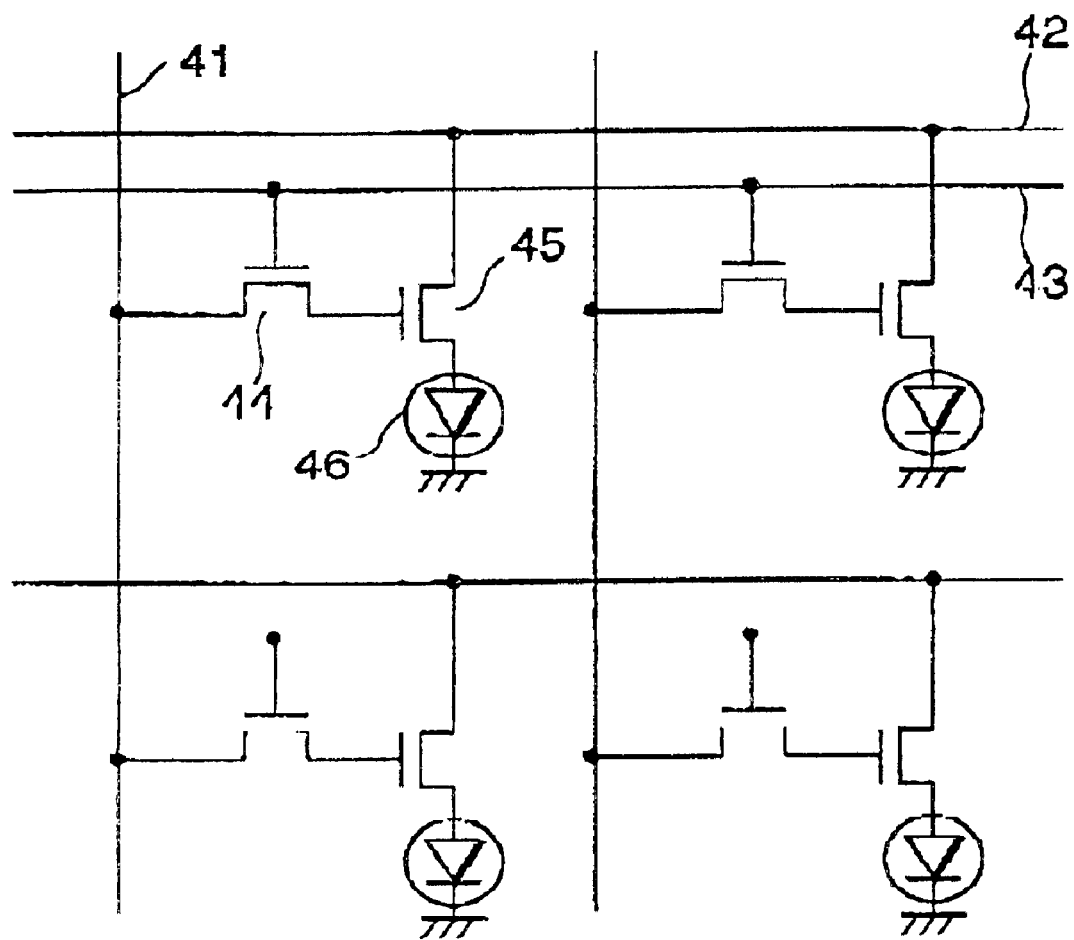
FIG. 5 is a circuit diagram of a plurality of pixels used in an organic light-emitting display device in accordance with the present invention.

As shown in FIG. 5, a pixel switching TFT 44 has the source connected to a signal line 41, and the gate connected to a gate line 43. When the pixel switching TFT 44 is selected by applying a scanning signal to the gate from the gate line 43 and an image signal to the source from the signal line 41, a driving TFT 45 turns on, a display element 46 is energized and a current is supplied from a current supply line 42 to the source of the driving TFT 45. The supplied current passes through the drain and enables the display element 46 to emit light.

As shown in FIG. 4(a), an undercoat layer 102 is laminated on a light transmissible substrate 101 and a p-Si layer 103 is formed on the undercoat layer 102 in an island shape. The p-Si layer 103 is divided into a source region 103a, a channel region 103b, and a drain region 103c. A gate insulating film 104 is coated on the undercoat layer 102 and the p-Si layer 103. A gate electrode 105 is formed in the region corresponding to the channel region 103b of the p-Si layer 103 via the gate insulating film 104. Further, the source and drain electrodes 107a and 107b connected to the source and drain regions of the p-Si layer 103, respectively, are electrically insulated from the gate electrode 105 by an interlayer insulating film 106. In a predetermined pixel area on the interlayer insulating film 106, the anode 109 made of a transparent material, for example, ITO (indium tin oxide) is formed in an island shape and electrically connected to the drain electrode 107b.

An opening is defined over the anode 109 by an organic partition insulating film 111 formed on an inorganic passivation film 110. An organic thin layer including at least an organic luminous layer 113 is laminated on the anode 109. A cathode 115 is continuously formed over a plurality of pixels opposite to the anode 109 via the organic thin layer. Such an organic thin layer is composed of, for example, the organic luminous layer 113, an anode buffer layer 112, and a cathode buffer layer 114. The anode buffer layer 112 and the cathode buffer layer 114 may be, however, made of an inorganic or organic material laminated film.

Figure 4B:
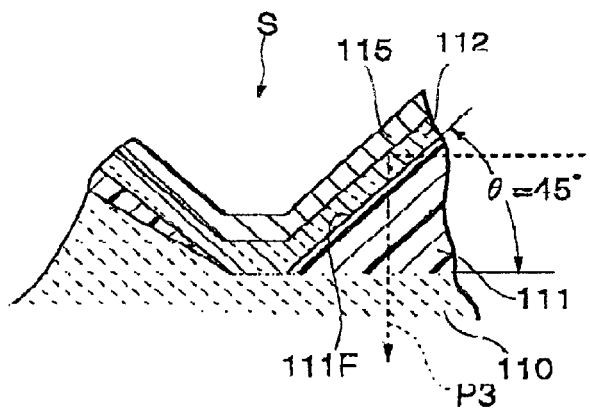
FIG. 4(b) shows an enlarged part of the pixel set forth in FIG. 4(a)

The partition insulating film 111 has an opening or recess S defined between the neighboring pixels as shown in FIGS. 4(a) and 4(b). Thus, the partition insulating film 111 is formed overall the periphery inside the edge of each pixel. Such an opening S is also schematically shown in FIG. 3(b). There are provided at the portion of the opening S inclined walls laminated with the partition insulating film 111, anode buffer layer 112 and cathode 115 on the side of the anode 109 (reference numeral 21 in FIG. 3(b)). Such an inclination is at an acute angle ($\theta<90°$), preferably, more than 45 degrees with respect to the light-projecting surface, the anode 109 or the substrate 101. With this structure, light advancing in the horizontal direction, i.e., light components $P_2$ and $P_3$ shown in FIGS. 4(a) and 4(b) are reflected on the surf ace of the cathode 115 made of a metallic film and advance toward the display surface. As a result, the luminous intensity of the display panel is increased.

The inclined angle may be, however, smaller than 90 degrees from the viewpoint of increasing the luminous intensity.

A manufacturing method for an organic light-emitting display device relating to this embodiment will be explained hereunder.

Firstly, a light transmissible substrate 101 such as a glass substrate is prepared. The undercoat layer 102 made of a lamination layer of a SiNx film with a thickness of 50 nm and a SiOx film with a thickness of 100 nm is formed on a main surface of the glass substrate 101. The p-Si layer 103 with a thickness of 50 nm is then deposited on the undercoat layer 102 in an island shape.

Next, the gate insulating film 104 made of SiOx, for example, with a film thickness of 140 nm is formed on the undercoat layer 102 and the p-Si layer 103. Further, the gate electrode 105 made of a MoW film with a thickness of 300 nm is deposited on the gate insulating film 104.

Ions are implanted into the p-Si layer 103 through the gate electrode 105 used as a mask. Thus, the region of the p-Si layer 103 positioned under the gate electrode 105 becomes a channel region 103b, the source region 103a and drain region 103c are respectively formed on both sides thereof.

Next, the interlayer insulating film 106 made of SiOx, for example, with a thickness of 660 nm is formed on the gate insulating film 104 and the gate electrode 105. Then, an ITO (indium tin oxide) film is formed on the interlayer insulating film 106 and a patterning process is applied to the ITO film to make the anode 109 as a first electrode in an island shape which covers a predetermined region.

A connecting hole is bored to reach the source and drain regions 103a and 103c through the interlayer insulating film 106 and the gate insulating film 104. A metallic film, such as, a laminated film of a Mo film with a thickness of 50 nm, an Al film with a thickness of 450 nm, and a Mo film with a thickness of 100 nm is embedded in this hole. Thus, the source and drain electrodes 107a and 107b are formed and the anode 109 is connected to the drain electrode 107b of the driving TFT.

Next, the passivation film 110 made of a SiNx film, for example, with a thickness of 450 nm is formed on the interlayer insulating film 106 and the surface of the anode 109. An opening is formed to make the outer surface of the anode 109 exposed. Further, the partition insulating film 111 is coated on the exposed surface of the anode 109 and the passivation film 110. The partition insulating film 111 is formed so as to cover the end of the anode 109. The first opening through which the surface of the anode 109 is exposed is formed at the area indicated by the arrow M. Also, the second opening is formed inside the edge of the pixel at the area indicated by the arrow S. This opening is defined to prevent a short circuit with the cathode 115 as described later. Further, a wall surface 111F of the partition insulating film 111 is made in the opening indicated by the arrow S, as shown in FIG. 4(b). The surface on the side of the anode 109 is inclined at an acute angle, for example, $\theta=45°$ with respect to the light-projecting surface or the substrate 101.

Next, the anode buffer layer 112 made of laminated layers for hole transportation, injection and the like is deposited on an upper surface of the partition insulating film 111 and the anode 109. The total thickness of the laminated layers is 110 nm, for instance. Then, the organic luminous layer 113 and the cathode buffer layer 114 composed of an electron injection layer and the like are deposited in order. The organic luminous layer 113 and the cathode buffer layer 114 each are 30 am in thickness. Finally, the cathode 115 is formed on the overall surface.

As a result, the light component $P_1$ among the light components $P_1$, $P_2$, $P_3$ radiated from the organic luminous layer 113 advances directly toward the display surface. The light components $P_2$ and $P_3$ advance in the horizontal direction via the partition insulating film 111 and are reflected toward the display surface by the cathode 115 on the wall surface at the opening, indicated by the arrow S, of the partition insulating film 111 on the side of the anode 109. Thus, the luminous intensity of the display device increases significantly.

A wire 108 may be laid as shown in the drawing between the pixels. It is desirable to define an inclined plane at the end portion of the wire 108 so that the inclined plane reflects the light components $P_2$ and $P_3$ inside the device.

At the portion indicated by the arrow S shown in FIG. 4(a) or 4(b) in the aforementioned embodiment, the light component $P_3$ passes through the partition insulating film 111, is reflected by the cathode 115 via the anode buffer layer 112, and then advances toward the display surface. The light component $P_3$ is attenuated twice according to the absorption coefficient (absorptive coefficient) of the anode buffer layer 112 and advances toward the light-projecting surface. As a result, the efficiency is lowered. In order to prevent that, where the cathode 115 is directly attached to the inclined wall surface 111F of the opening of the partition insulating film 111, attenuation of the light component $P_3$ can be substantially avoided.

Figure 6:
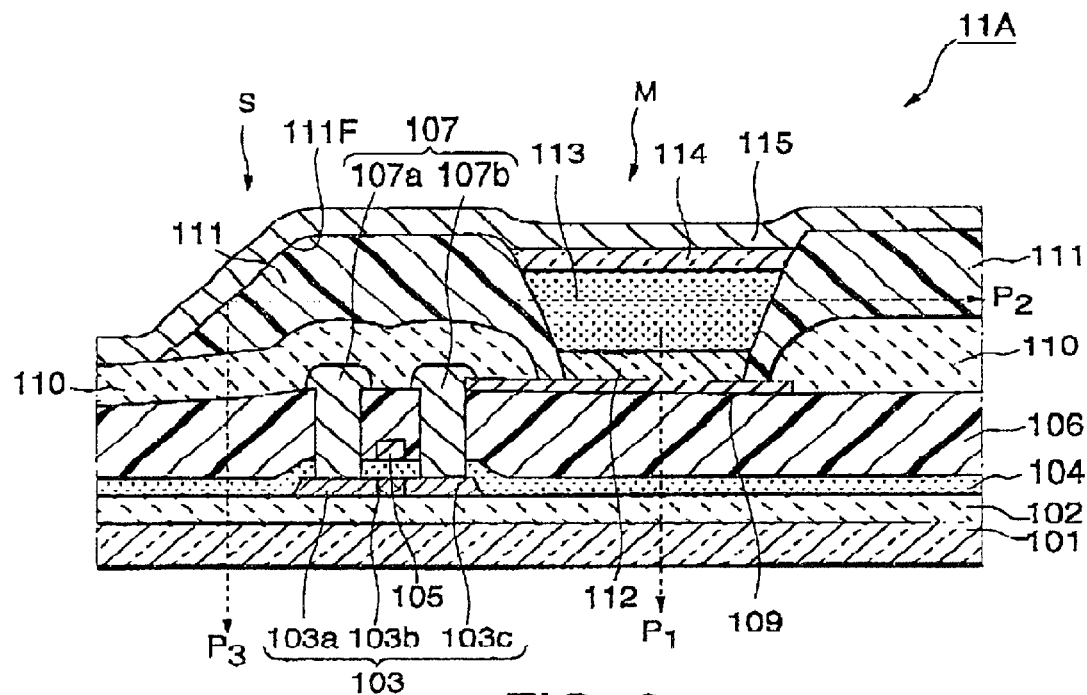
FIG. 6 shows a longitudinal cross section of a pixel in accordance with the second embodiment of the present invention.

FIG. 6 is a longitudinal cross-section of the pixel of the second embodiment of an organic light-emitting display device in accordance with the present invention. The same numerals in FIG. 6 denote substantially the same or corresponding elements as those in FIGS. 4(a) and 4(b) and the explanation thereof will be omitted.

A reference numeral 11A generally designates a pixel. In the same way as with the first embodiment, an opening is provided at the area indicated by arrow S and the wall surface 111F on the side of the anode 109 is inclined, for example, at about 45 degrees with respect to the light-projecting surface. The anode buffer layer 112, the organic luminous layer 113, and the cathode buffer layer 114 are respectively formed on the anode 109 in the region surrounded by the partition insulating film 111, and the cathode 115 is formed on the pixel 11A. The cathode 115 is directly attached to the wall surface 111F of the partition insulating film 111 inclined at about 45 degrees with respect to the light-projecting at the portion indicated by the arrow S.

The light components $P_3$ (and $P_2$) advancing in the horizontal direction from the organic luminous layer 113 is directly reflected by the cathode 115 on the inclined surface of the partition insulating film 111. Thus, the light components $P_3$ is not attenuated by the anode buffer layer 112 as mentioned above. The luminous intensity of the display device can be increased more than that set forth in the embodiment shown in FIGS. 4(a) and 4(b).

As mentioned above, an opening is provided between the neighboring pixels of the organic light-emitting display device and the wall surface of the opening of the partition insulating film is made at an acute angle with respect to the light-projecting surface, the anode 109 or the substrate 101 so that light leaking in the direction parallel to the light-projecting surface can be guided to the light-projecting surface efficiently from the pixel.

Namely, the electrode on the side opposite to the light-projecting surface is made of a material with a high reflection factor and the electrode is configured to make an acute angle with respect to the light-projecting surface at the end portion of each pixel, so that light emitted from the organic luminous layer can be projected efficiently from the light-projecting surface.

Further, where the opening is provided around the entire internal surface of the edge portion of each pixel, that structure can prevent light from leaking and suppress crosstalk between the neighboring pixels. As a result, the contrast of the light-emitting display device is improved and color mixture between the neighboring pixels can be significantly avoided in the case of a color display.

The organic luminous layer set forth ion the first and second embodiment is made by applying vapor deposition of small molecular materials, e.g., $Alg_3$ or the like.

Figure 7:
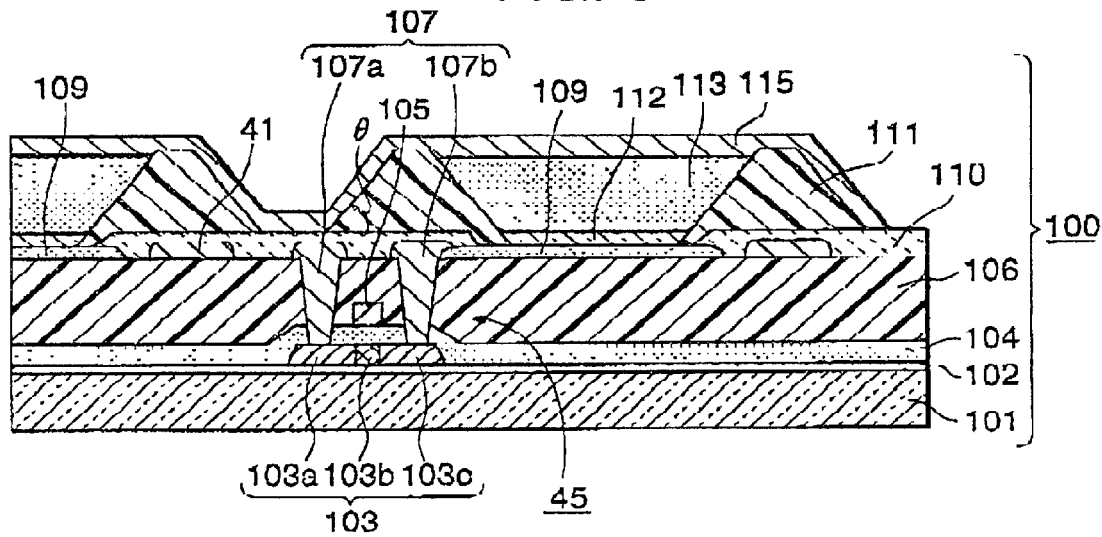
FIG. 7 is a longitudinal cross section of a pixel of a light-emitting display device in accordance with the present invention.

Now referring to FIG. 7, there is shown a longitudinal cross-section of an array substrate in an organic light-emitting display device as a third embodiment of the present invention. An organic luminous layer 113 is made of a highly polymerized compound, e.g., polyfluorene. The luminous layer 113 is formed by using a method of jetting an ink corresponding to a color of red (R), green (G) or blue (B). Namely, the highly polymerized system organic luminous material is sequentially jetted out toward an opening defined by a partition insulation film 111 and an anode buffer layer 112 so that the organic luminous layer 113 is formed. The thickness of the anode buffer layer 112 may be 30 nm while that of the luminous layer 113 may be 80 nm in this embodiment.

Since the luminous layer 113 is formed in such a way as set forth above by using the highly polymerized system luminous material, this embodiment is easily adaptive to changes in design of various sizes of the array substrate. Further, because an appropriate quantity of the luminous material is selectively jetted out toward a necessary portion, the luminous material may be efficiently used.

Figure 8:
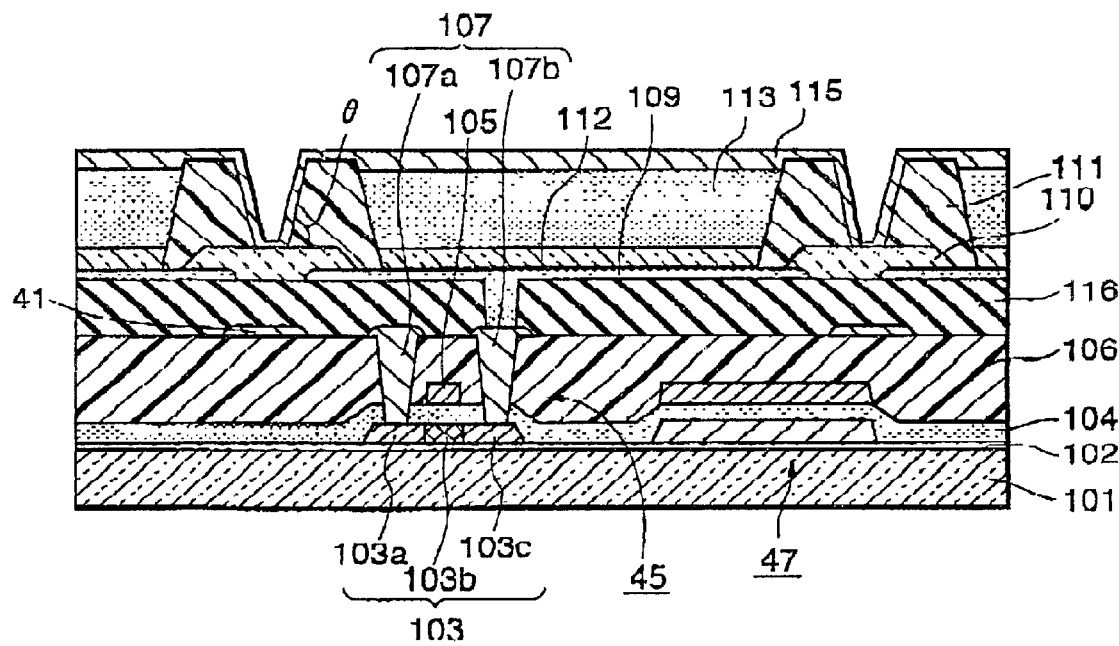
FIG. 8 is a longitudinal cross-section of a pixel of a light-emitting display device in accordance with the present invention.

Next, a fourth embodiment of the present invention will be described with reference to FIG. 8 which shows a cross-sectional view of an organic light-emitting display device. In this embodiment, a driving TFT (driving element) 45 is connected to a first electrode, i.e., an anode 109. As shown, the anode 109 is connected to a drain electrode 107*b* of the driving TET 45 through an insulation film 116. A signal line 41 is formed on an interlayer insulating film 106. The insulation film 116 is also provided to cover the signal line 41 and the interlayer insulating film 106.

According to this embodiment, since the insulation layer film 116 is provided between the first electrode 109 and the signal line 41, the first electrode 109 of this embodiment has more of a degree of freedom for disposition than that of the first, second or third embodiment in which the first electrode 109 is disposed on the same plane as the signal line 41. In addition, this embodiment is capable of increasing a luminous area.

Figure 9:
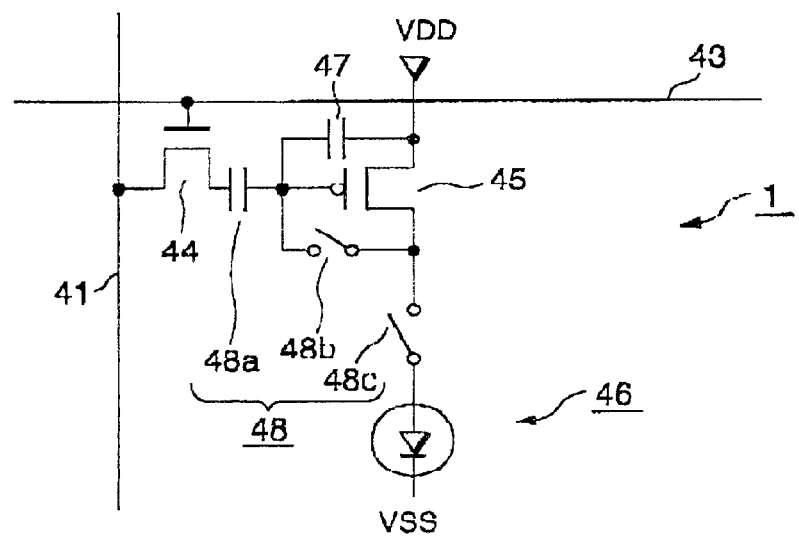
FIG. 9 is a circuit diagram of panel array elements in a light emitting display device in accordance with the present invention.
Figure 10:
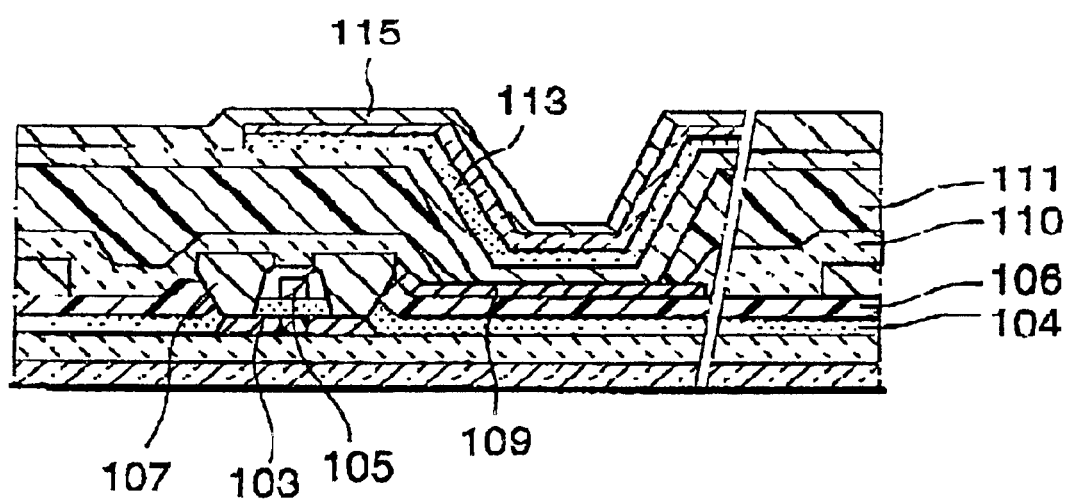
FIG. 10 is a longitudinal cross-section of a pixel of a conventional organic light-emitting display device.

It should be noted that the present invention is not limited to the embodiments set forth above but has various variations. As shown in FIG. 9, for example, a pixel 1 includes a pixel switch (TFT) 44 to select a pixel to which a video signal is supplied from a Y-direction driving circuit 123 in response to a scanning signal supplied from an X-direction driving circuit 121, a first capacitor 47 to hold during one horizontal scanning period the video signal supplied from a signal line 41 through the pixel switch 44, a driving element (TFT) 45 to supply a driving current to a display element 46 in accordance with the video signal, and a reset circuit 48.

The pixel switch 44 and the driving element 45 are composed of an n-type TFT and a p-type TET, respectively. The reset circuit 48 includes a second capacitor 48*a* disposed between the drain electrode of the pixel switch 44 and the gate of driving element 45, a first switch 48*b* connected between the gate and drain electrode of the driving element 45 and a second switch 48*c* between the drain electrode of the driving element 45 and the first electrode of the display element 46.

Meanwhile, the display element set forth hereinabove means a laminated layer device which includes a first electrode and a second electrode provided opposite to the first electrode and a light-emitting device held between the first and second electrode. Further, the light-emitting device (organic thin layer) may be composed of an anode buffer layer commonly formed for each color, a cathode buffer layer and a luminous layer provided for each color. The light-emitting device may be also functionally composite double layer or a single layer.

In the embodiments explained above, the anode is made transparent and disposed on the side of light-projecting surface and the cathode is provided as a light-reflecting electrode disposed on the side opposite to the light-projecting surface. However, there may be other structures. The cathode, for instance, which is made of an optically transparent and electrically conductive film maybe disposed on the side of light-projecting surface while the anode which is a laminated film made of an electrically conductive file and a metal layer may be disposed on the side opposite to the light-projecting surface.

In addition, a light transmitting display device in the embodiments described above projects light to the outer outside through the array substrate on which TFTs and other elements are disposed. As one of its alternatives, the second electrode is made of a transparent conductive film so that light can be projected to the outside through the second electrode. In any cases, it is important to dispose a light projecting surface between neighboring pixels in order for light traveling from one pixel toward the other of the neighboring pixels to pass through the light projecting surface.

By way of example, the opening defined by the anode buffer layer 112 and the partition insulation film 111 is provided at the entire surrounding of the pixel in the embodiments described above. The opening may be formed in a stripe shape along the row of a pixel. In the case of color display, a mixture of colors between neighboring pixels can be suppressed significantly if each color of red, green or blue is formed in such a stripe shape.

A light-emitting display device is not only an organic luminous display device such as an electro-luminescence device, but also other display devices may be applied.

As set forth above, according to the present invention, there can be provided a light-emitting display device capable of improving throughput efficiency of light to the light-projecting surface. Further, a light-emitting display device of the present invention has the advantage of substantial suppression or reduction on cross talk between neighboring pixels.

What I claim is:

1. A light-emitting display device comprising:
    (1) a plurality of pixels disposed in a matrix form, each of said pixels comprising,
        i) a first electrode electrically isolated from the first electrodes of other pixels,
        ii) a second electrode provided opposite to said first electrode, wherein one of said first and second electrodes is arranged in a light-projecting surface, and
        iii) a light-emitting device held between said first and second electrodes, said light-emitting device including at least a light-emitting layer and said light-emitting device being located in a first region of said pixel; and
    (2) a light-reflecting surface provided in a second region, said second region surrounding each of said pixels, to reflect light traveling horizontally from the light emitting layer of one of said pixels to adjoining pixels toward said light-projecting surface.

2. A light-emitting display device according to claim 1, wherein:
    said light-emitting display device further includes partition insulation film to electrically isolate said first electrodes from each other;
    said partition insulation film define openings between said adjacent ones of said pixels, the other of said first and second electrodes provided opposite to said light-projecting surface via said light-emitting device includes inclined surfaces provided along said openings of said partition film; and said inclined surfaces are used for said light-reflecting surfaces and define an acute angle with respect to said light-projecting surface.

3. A light-emitting display device according to claim 2, wherein said second electrodes are continuously formed on said pixels.

4. A light-emitting display device according to claim 2, wherein said inclined surfaces are formed around said pixels.

5. A light-emitting display device according to claim 1, wherein said light-emitting display device further includes partition films to electrically insulate said first electrodes from each other, said partition insulation films define openings around said pixels, and said second electrodes are provided to cover said partition insulation films and include inclined surfaces at said openings which define an acute angle with respect to said light-projecting surface.

6. A light-emitting display device comprising:

a substrate;

pixels provided in a matrix form on said substrate, each of said pixels including,
  i) a first electrode electrically isolated from the first electrodes of other pixels,
  ii) a second electrode provided opposite to said first electrode, wherein said first electrode or said second electrode is optically transmissible and define a light-projecting surface, and
  iii) luminous layer held between said first and second electrodes, said luminous layer being located in a first region of said pixel;

a light-reflecting surface provided in a second region, said second region surrounding each of said pixels, reflect light traveling horizontally from the luminous layer of one of said pixels to adjoining pixels toward said light-projecting surface; and thin film transistors connected to said pixels and provided between said pixels and said light-reflecting surfaces.

7. A light-emitting display device according to claim 6, wherein:

said light-emitting display device further includes partition insulation film to electrically isolate said first electrodes from each other;

said partition insulation film define openings between said adjacent ones of said pixels;

the other of said first and second electrodes provided opposite to said light-projecting surface includes inclined surfaces provided along said openings of said partition film; and said inclined surfaces are used for said light-reflecting surfaces and define an acute angle with respect to said light-projecting surface.

8. A light-emitting display device according to claim 6, wherein said luminous layer is made of highly polymerized compound.

9. A light-emitting display device according to claim 7, wherein said luminous layer is made of highly polymerized compound.

10. A light-emitting display device according to claim 6, wherein said thin film transistors include poly crystalline silicon layers.

* * * * *